(12) United States Patent
Feurprier et al.

(10) Patent No.: US 9,385,078 B1
(45) Date of Patent: Jul. 5, 2016

(54) SELF ALIGNED VIA IN INTEGRATED CIRCUIT

(71) Applicants: International Business Machines Corporation, Armonk, NY (US); Tokyo Electron Limited, Tokyo (JP); STMicroelectronics, Inc., Coppell, TX (US)

(72) Inventors: Yannick Feurprier, Watervliet, NY (US); Joe Lee, Albany, NY (US); Lars W. Liebmann, Poughquag, NY (US); Yann Mignot, Slingerlands, NY (US); Terry A. Spooner, Clifton Park, NY (US); Douglas M. Trickett, Altamont, NY (US); Mehmet Yilmaz, Ankara (TR)

(73) Assignees: INTERNATIONAL BUSINESS MACHINES CORPORATION, Armonk, NY (US); STMICROELECTRONICS, INC., Coppell, TX (US); TOKYO ELECTRON LIMITED (JP)

( * ) Notice: Subject to any disclaimer, the term of this patent is extended or adjusted under 35 U.S.C. 154(b) by 0 days.

(21) Appl. No.: 15/064,688

(22) Filed: Mar. 9, 2016

Related U.S. Application Data

(63) Continuation of application No. 14/749,140, filed on Jun. 24, 2015.

(51) Int. Cl.
*H01L 23/522* (2006.01)
*H01L 21/768* (2006.01)

(52) U.S. Cl.
CPC ...... *H01L 23/5226* (2013.01); *H01L 21/76843* (2013.01)

(58) Field of Classification Search
CPC ............ H01L 23/5226; H01L 21/76802; H01L 21/76843; H01L 23/528; H01L 23/5329
See application file for complete search history.

(56) References Cited

U.S. PATENT DOCUMENTS

2013/0234336 A1 9/2013 Richter et al.
2013/0334659 A1 12/2013 Liu et al.

OTHER PUBLICATIONS

List of IBM Patents or Patent Applications Treated as Related; (Appendix P), Filed Apr. 26, 2016, 2 pages.
List of IBM Patents or Patent Applications Treated as Related; (Appendix P), Filed May 20, 2016, 2 pages.
Yannick Feurprier, et al., "Self Aligned Via in Integrated Circuit", U.S. Appl. No. 14/749,140, filed Jun. 24, 2015.
Yannick Feurprier, et al., "Self Aligned Via in Integrated Circuit", U.S. Appl. No. 15/152,981, filed May 12, 2016.

*Primary Examiner* — Douglas Menz
*Assistant Examiner* — Neil Prasad
(74) *Attorney, Agent, or Firm* — Cantor Colburn LLP; Steven Meyers

(57) ABSTRACT

A method for forming a via in an integrated circuit comprises patterning a first opening in a first hardmask, the first hardmask disposed on a first organic self-planarizing polymer (OPL) layer, removing an exposed portion of the first OPL layer to define a cavity, removing an exposed portion of a second hardmask in the cavity, removing an exposed portion of a first dielectric layer disposed under the second hardmask to further define the cavity, removing an exposed portion of a first cap layer in the cavity, removing an exposed portion of a second dielectric layer to further define the cavity, removing an exposed portion of a second cap layer to further define the cavity, removing an exposed portion of a liner layer over a second conductive material in the cavity, and depositing a conductive material in the cavity.

1 Claim, 10 Drawing Sheets

SELF ALIGNED VIA IN INTEGRATED CIRCUIT

PRIORITY

This application is a continuation of and claims priority from U.S. patent application Ser. No. 14/749,140, filed on Jun. 24, 2015, entitled "SELF ALIGNED VIA IN INTEGRATED CIRCUIT", the entire contents of which are incorporated herein by reference.

BACKGROUND

The present invention relates to integrated circuits, and more specifically, to electrical connections in multilayer integrated circuits.

Integrated circuits often include interconnect layers that include lines of conductive material such as copper, aluminum, tungsten, silver, or alloys that include copper and tungsten. Integrated circuits also often include multiple layers that are electrically connected using vertical connections called vias.

The interconnect layers may be connected to devices on the integrated circuit by the vias. The vias are often etched through layers of the integrated circuit and filled with a conductive material. It is desirable to form vias having a high aspect ratio and low resistance.

SUMMARY

According to an embodiment of the present invention, a method for forming a via in an integrated circuit comprises patterning a first opening in a first hardmask, the first hardmask disposed on a first organic self-planarizing polymer (OPL) layer, removing an exposed portion of the first OPL layer to define a cavity, removing an exposed portion of a second hardmask in the cavity, removing an exposed portion of a first dielectric layer disposed under the second hardmask to further define the cavity, removing an exposed portion of a first cap layer in the cavity, removing an exposed portion of a second dielectric layer to further define the cavity, removing an exposed portion of a second cap layer to further define the cavity, removing an exposed portion of a liner layer over a second conductive material in the cavity, and depositing a conductive material in the cavity.

According to another embodiment of the present invention, a method for forming a via in an integrated circuit comprises patterning a first opening in a first hardmask, the first hardmask including a titanium nitride (TiN) layer disposed on a first organic self-planarizing polymer (OPL) layer, removing an exposed portion of the first OPL layer to define a first cavity, removing an exposed portion of a second hardmask in the first cavity, removing an exposed portion of a first dielectric layer disposed under the second hardmask to further define the first cavity, depositing a second OPL layer over the first hardmask and in the first cavity, patterning an opening in the second OPL layer and second opening in a first hardmask, removing the second OPL layer to expose the first hardmask, removing an exposed portion of the first OPL layer defined by the second opening in the first hardmask to define a second cavity, removing an exposed portion of the second hardmask in the second cavity and removing a exposed portion of a first cap layer in the first cavity, removing an exposed portion of the first dielectric layer in the second cavity and an exposed portion of a second dielectric layer in the first cavity, removing an exposed portion of the first cap layer in the second cavity and an exposed portion of a second cap layer in the first cavity, removing an exposed portion of a liner layer over a first conductive material in the second cavity and an exposed portion of a liner layer over a second conductive material in the first cavity, and depositing a conductive material in the first cavity and the second cavity.

According to yet another embodiment of the present invention, an integrated circuit comprises a first interconnect including a conductive material, a first dielectric material layer disposed on the first interconnect, a cavity partially defined by the conductive material of the first interconnect and the first dielectric material layer, a single liner layer disposed over the conductive material of the first interconnect, and a conductive material disposed on the single liner layer in the cavity, wherein the conductive material disposed on the single liner layer in the cavity partially defines a conductive via.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Integrated circuits having multiple layers often include interconnect layers with conductive lines called interconnects. The conductive lines are often formed from metallic materials such as, for example, copper, silver, aluminum, tungsten, or an alloy such as copper tungsten. Prior to depositing the metallic material, a liner layer may be deposited in a channel that defines the line. A cap layer may also be deposited over the metallic material following the formation of the line. The liner layer is often used to reduce or discourage oxidation on the metallic material. In previous methods of fabrication, the liner layer deposited on the interconnect was exposed when the via was patterned. A second liner layer was deposited over the first liner layer, and the walls of the via cavity prior to depositing the conductive material in the via. Thus, two liner layers were disposed in the connection point between the interconnect and the via. The two liner layers undesirably increased the resistance of the via to interconnect connection.

The interconnects may be connected vertically to other interconnects or to devices on the integrated circuit using vias that are generally formed by forming a high aspect ratio cavity in the integrated circuit and filling the cavity with conductive material. The methods described herein provide a method for forming a high aspect ratio via through multiple layers while improving the conductivity of the via or reducing the resistance of the via. The method also provides for forming vias having different depths which contact interconnects on different interconnect layers of an integrated circuit.

Figure 1:
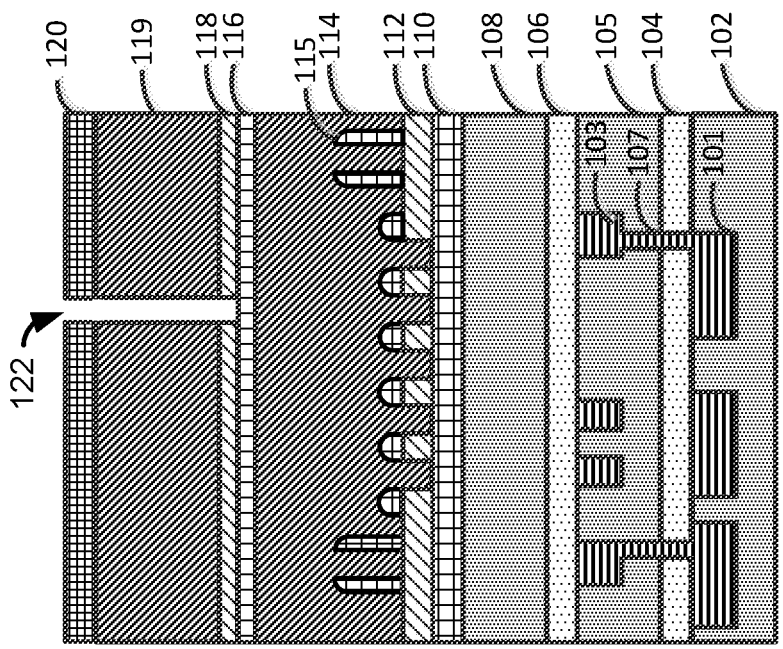
FIG. 1 illustrates a side cut-away view of a portion of an exemplary embodiment of an integrated circuit in fabrication.

FIG. 1 illustrates a side cut-away view of a portion of an exemplary embodiment of an integrated circuit in fabrication. A first interconnect layer includes conductive lines 101 that may include, for example, a metallic material such as copper, silver, or an alloy such as copper tungsten. The conductive lines 101 are embedded in a first dielectric layer 102 and covered with a first cap layer 104 that may include for example, a nitride or oxide material such as silicon nitride ($Si_xN_x$), silicon carbon nitride (SiCN), silicon oxynitride (SiON), or silicon oxide ($SiO_x$) or any other suitable material including an insulator material. A second dielectric layer 105 is arranged on the first cap layer 104. The second dielectric layer 105 may include, for example, silicon oxide, fluorinated silicon oxide, low k dielectric materials such as, for example, hydrogenated silicon oxycarbide and porous hydrogenated silicon oxycarbide materials. A second interconnect layer includes conductive lines 103 that are embedded in the second dielectric layer 105. In the illustrated embodiment a conductive line 103 is electrically connected to the conductive line 101 by a conductive material portion 107 that is imbedded in the second dielectric layer 105. A second cap layer 106 that may include any of the exemplary materials of the first cap layer 104 described above, is arranged on the dielectric layer 105 and the conductive lines 103. A third dielectric layer 108 is arranged on the second cap layer 106. The third dielectric layer 108 will provide a layer for trench formation (described below). A first hardmask layer 110 is arranged on the third dielectric layer 108. The first hardmask layer 110 may include, for example an oxide or nitride material. A second hardmask layer 112 may be arranged on the first hardmask layer 110 in some embodiments. The second hardmask layer 112 may include a material such as, for example titanium nitride (TiN). In some embodiments, an oxide material layer 115 may be arranged over the second hardmask layer 112. In the illustrated embodiment, the oxide material layer 115 and the second hardmask layer 112 have been patterned using a sidewall image transfer (SIT) technic. Alternative patterning techniques include, for example, a lithographic etch sequence (LELE or LELELE). An organic self-planarizing polymer (OPL) layer 114 is formed over the oxide material layer 115. The OPL layer 114 may include, for example, a material having a hydrocarbon component of approximately 75%-90% with remaining components including a combination of oxygen with hydrogen, and nitrogen. A third hardmask layer 116 includes an oxide material, which is disposed on the OPL layer 114. A fourth hardmask layer 118 that includes a TiN material is arranged on the third hardmask layer 116. A second OPL layer 119 is arranged on the hardmask layer 118.

FIG. 1 also illustrates a masking layer 120 that is lithographically transferred from a resist mask (not shown) on the second OPL layer 119 to partially define the location of a first via (described below). The masking layer 120 may include, for example a silicon containing anti-reflective coating (SiARC) layer and a resist layer that defines via locations. In the illustrated embodiment, a cavity 122 is formed in the second OPL layer 119 and the fourth hardmask 118. The cavity 122 is formed by an etching process, for example, a carbon fluorine etching process that removes exposed portions of the second OPL layer 119. The TiN portion of the fourth hardmask 118 may be etched by, for example, a chlorine based chemical etching process.

Figure 2:
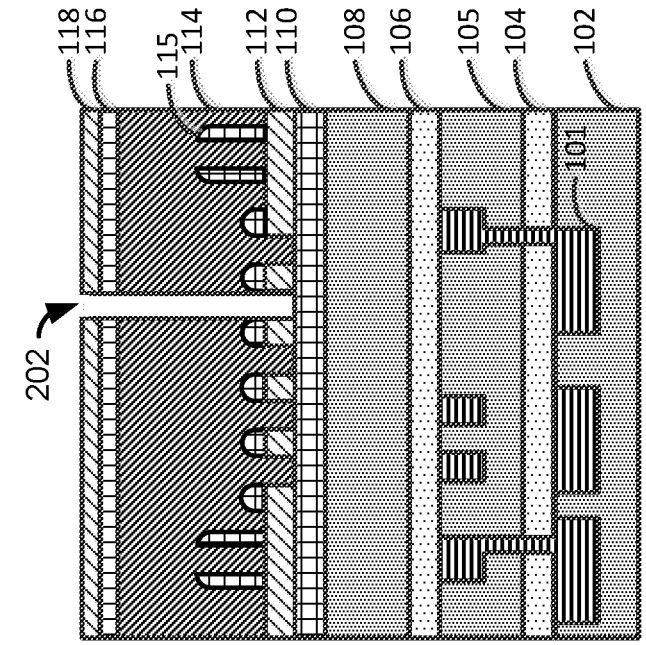
FIG. 2 illustrates the formation of a cavity.

FIG. 2 illustrates the formation of a cavity 202 that is formed by an etching process that removes an exposed portion of the hardmask 116. The oxide portion of the third hardmask 116 may be etched by, for example, a carbon fluorine etching process. When the hardmask 116 is etched, the mask 120 is removed. The exposed portions of the OPL layer 114 are removed using, for example, a reactive ion plasma etching process that is selective to oxide and TiN such that the etching process removes the OPL layer 114 material and ceases when the underlying oxide of the first hardmask layer 110 is exposed. The OPL layer 119 is removed when the OPL layer 114 is etched to form the cavity 202. The reactive ion plasma etching process may, for example, use an oxygen, nitrogen/hydrogen mixture, or a carbon monoxide/carbon dioxide mixture.

Figure 3:
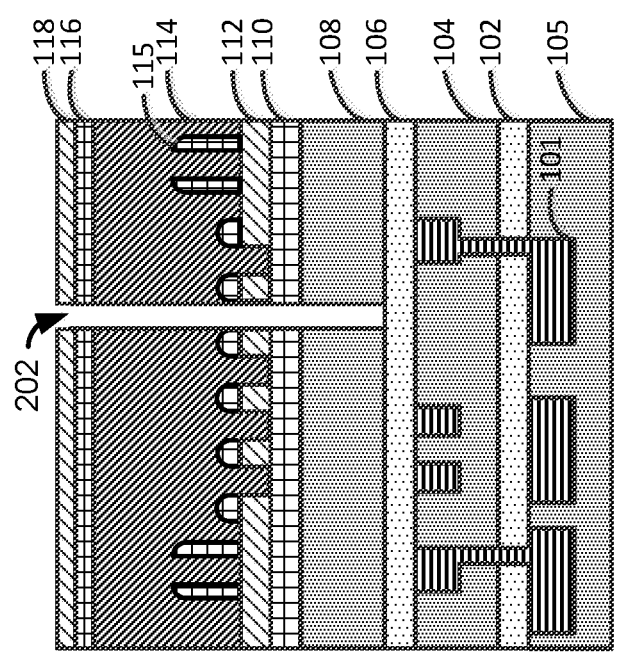
FIG. 3 illustrates the resultant structure following an etching process that removes exposed portions of the hardmask layer.

FIG. 3 illustrates the resultant structure following an etching process that removes exposed portions of the first hardmask layer 110 and the dielectric layer 108. The first hardmask layer 110 may be removed by, for example, a carbine fluorine RIE process. The underlying third dielectric layer 108 may be removed by, for example, a carbon hydrogen fluorine RIE process. The carbon hydrogen fluorine RIE process is selective to oxide and TiN, and thus ceases when the second cap layer 106 is exposed. The etching of the first hardmask layer 110 and the third dielectric layer 108 increases the depth of the cavity 202 to stop on the cap layer 106.

Figure 4:
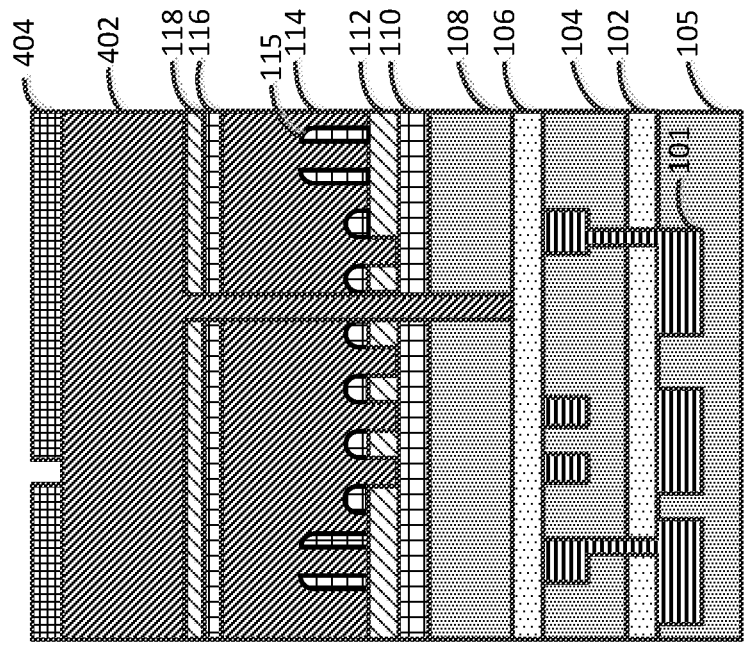
FIG. 4 illustrates the formation of an OPL layer.

FIG. 4 illustrates the formation of an OPL layer 402 over the fourth hardmask layer 118. The OPL layer 402 material 402 fills the cavity 202 (of FIG. 3). The OPL layer 402 is formed by, for example, a spin on deposition method. A masking layer 404 is patterned on the OPL layer 404 using a lithographic patterning process for example. The masking layer may include, for example a silicon containing anti-reflective coating (SiARC) layer and a resist layer.

Figure 5:
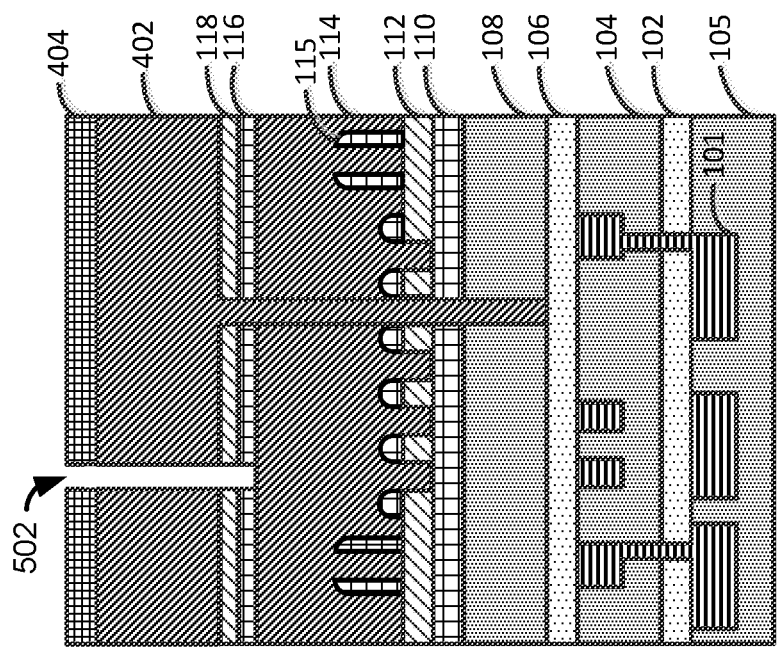
FIG. 5 illustrates the formation of a cavity.

FIG. 5 illustrates the formation of a cavity 502 in the OPL layer 402 and the fourth hardmask layer 118 and third hardmask layer 116 using an etching process similar to the processes described above to form the cavity 202 (of FIG. 2).

Figure 6:
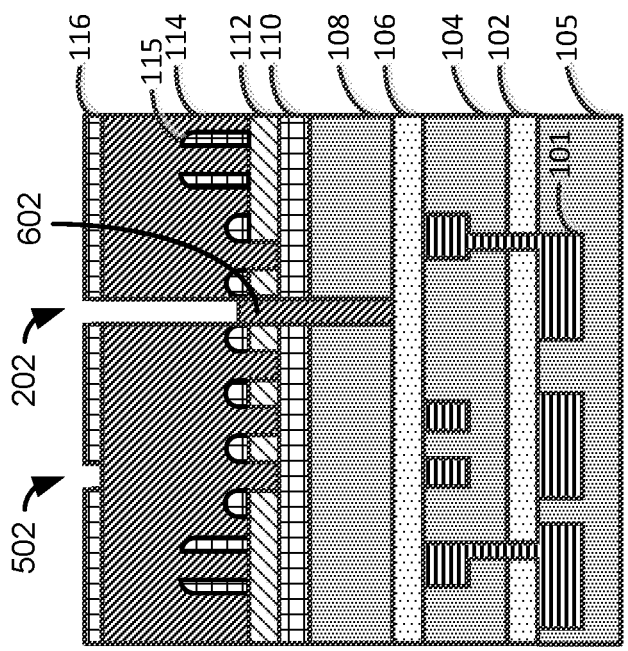
FIG. 6 illustrates the removal of the masking layer, the OPL layer and the hardmask layer.

FIG. 6 illustrates the removal of the masking layer 404, the OPL layer 402 and the hardmask layer 118 using a Chlorine base RIE chemistry. The removal of the OPL layer 402 also removes a portion of the OPL material from the cavity 202. In the illustrated exemplary embodiment, a portion of the OPL material 602 may remain in the cavity 202. The OPL material may be removed using, for example, oxygen ($O_2$), a nitrogen (N$_2$)/hydrogen (H$_2$) mixture, or a carbon monoxide (CO)/carbon dioxide (CO$_2$) mixture in a reactive ion plasma etch process.

Figure 7:
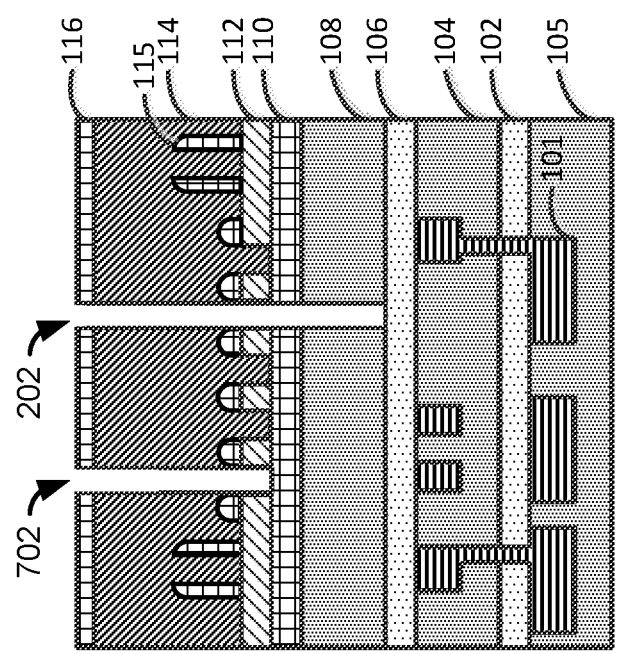
FIG. 7 illustrates the formation of a cavity.

FIG. 7 illustrates the formation of a cavity 702 following an etching process that removes exposed OPL material 114 using, for example, a reactive ion plasma etching process as described above. The etching process also removes the exposed OPL material 602 (of FIG. 6) that remained in the cavity 202 thereby increasing the depth of the cavity 202 to expose the cap layer 106.

Figure 8:
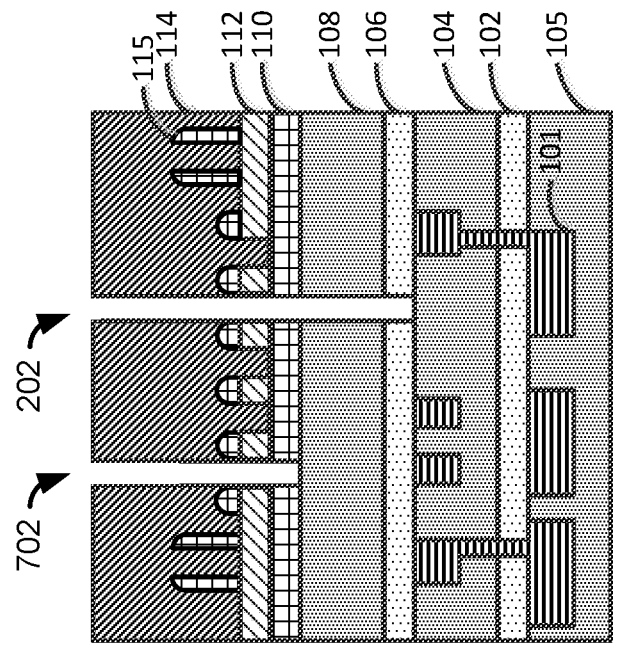
FIG. 8 illustrates the resultant structure following an etching process.

FIG. 8 illustrates the resultant structure following an etching process such as, for example a carbon fluorine etching process that removes exposed portions of the first hardmask layer 110 to increase the depth of the cavity 702 and expose the underlying third dielectric layer 108. The etching process also removes portions of the second cap layer 106 in the cavity 202 to expose a portion of the underlying second dielectric layer 105.

Figure 9:
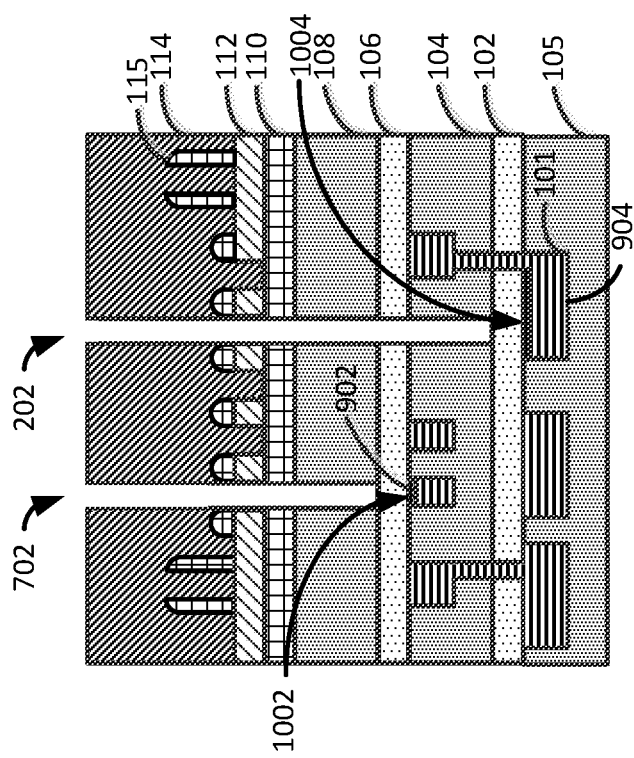
FIG. 9 illustrates the resultant structure following another etching process that removes exposed portions of the dielectric layers.

FIG. 9 illustrates the resultant structure following an etching process that removes exposed portions of the third and second dielectric layers 108 and 105 in the cavities 702 and 202, respectively, and exposes respective second and first cap layers 106 and 104. The etching process includes, for example, a carbon-hydrogen fluorine etching process. The interconnects 902 and 904 may have top surfaces that are covered with a barrier cap layer 1002 and 1105 respectively that may include, for example, ruthenium, tantalum, titanium, tungsten, iridium, rhodium, cobalt, copper or platinum or a mixture thereof. The barrier cap layers 1002 and 1004 are not shown in previous figures for clarity.

Figure 10:
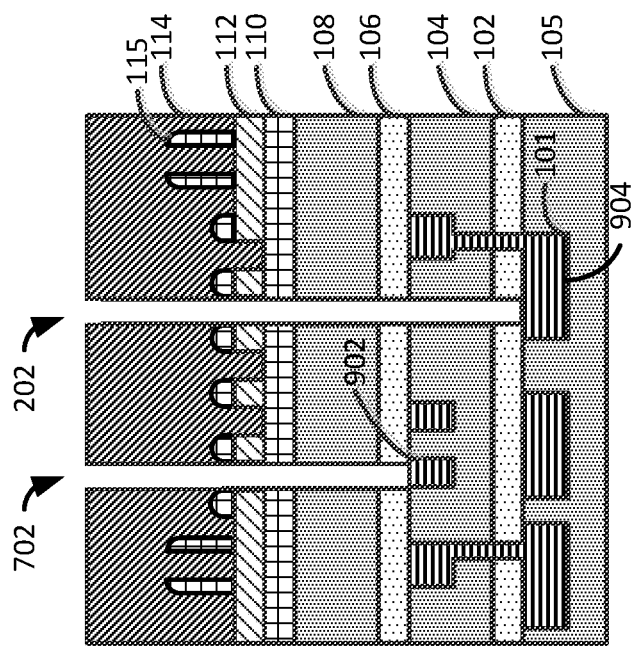
FIG. 10 illustrates the resultant structure following the removal of a portion of the hardmask layer in the cavity, and the liner layer.

FIG. 10 illustrates the resultant structure following the removal of a portion of the second cap layer 106 in the cavity 702, and the barrier cap layer 1002 (of FIG. 9), which exposes a portion of the interconnect 902, and a removal of a portion of the first cap layer 104 and the barrier cap layer 1004, which exposes a portion of the interconnect 904 in the cavity 202.

Figure 11:
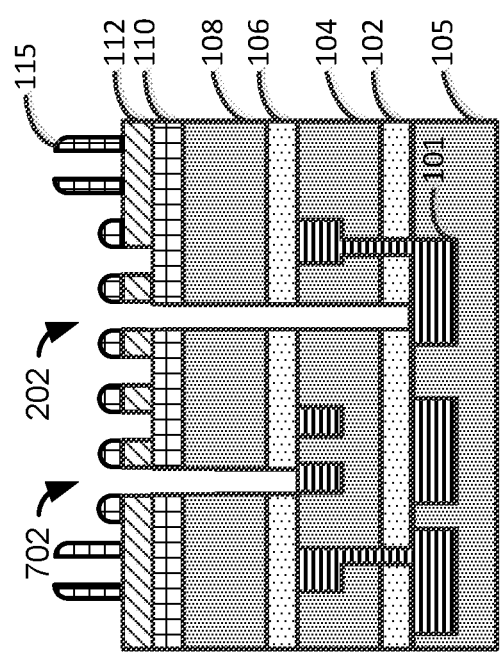
FIG. 11 illustrates the removal of the OPL layer.

FIG. 11 illustrates the removal of the OPL layer 114 using, for example, a reactive ion plasma etching process as described above.

Figure 12:
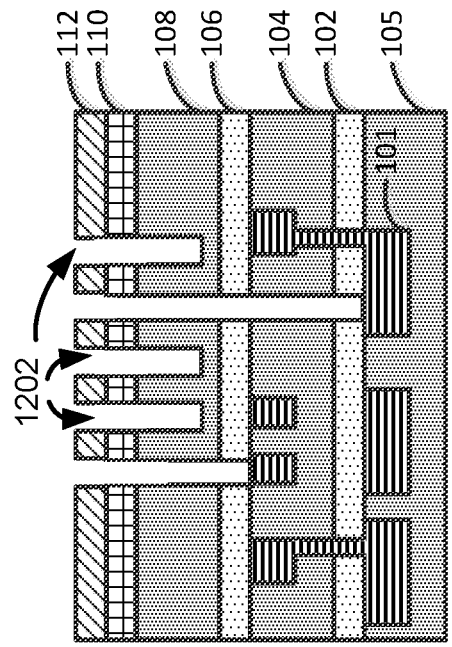
FIG. 12 illustrates the formation of trenches.

FIG. 12 illustrates the formation of trenches 1202 that may be formed in the dielectric layer 108 using, for example, a reactive ion etching process that is selective to the second hardmask layer 112 and removes exposed portions of the oxide layer 115, the first hardmask layer 110 and the third dielectric layer 108 using, for example, a carbon fluorine reactive ion etching process followed by a hydrogen and fluorine reactive ion etching process. Following the formation of the trenches 1202, the wafer may be cleaned using, for example, a wet cleaning process that removes residue and damaged layers. The wet cleaning process may remove the TiN hardmask layer 112 in some embodiments. The wet cleaning process may remove the Oxide layer 110 in some embodiments when TiN hardmask 112 has also been removed.

Figure 13:
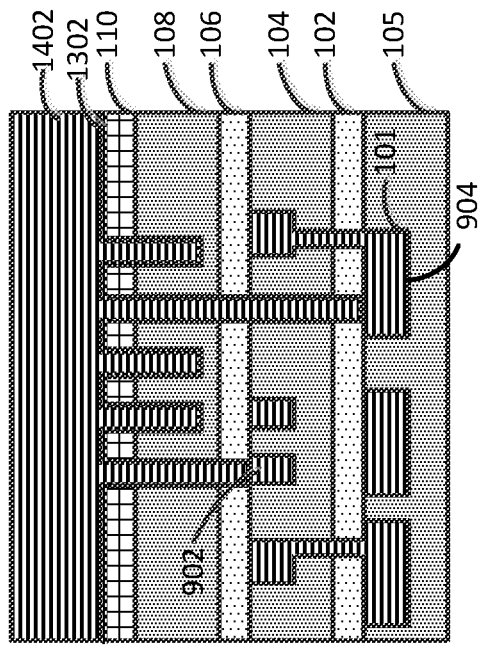
FIG. 13 illustrates the deposition of a liner layer in the cavities.

FIG. 13 illustrates the deposition of a liner layer 1302 in the cavities 702, 202 and the trenches 1202. The liner layer may include, for example, ruthenium, tantalum, titanium, tungsten, iridium, rhodium, or platinum or a mixture thereof. The liner layer is deposited with a thickness of, for example, approximately 1 nm-5 nm using a physical vapor deposition (PVD) process, chemical vapor deposition (CVD) process, or an atomic layer deposition (ALD) process. The liner layer 1302 covers exposed portions of the interconnects 902 and 904.

Figure 14:
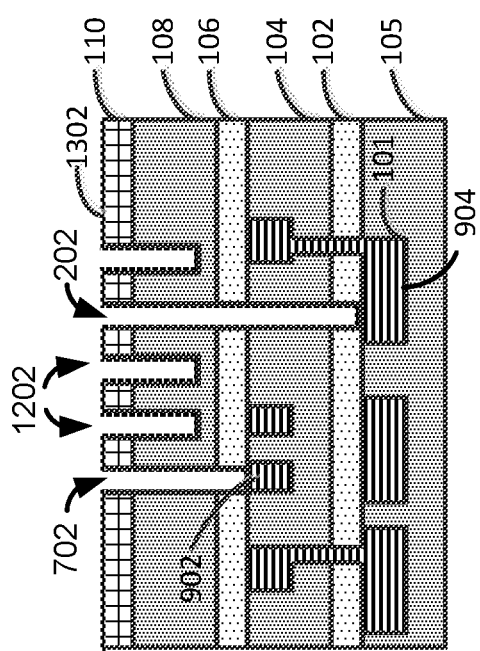
FIG. 14 illustrates the deposition of a conductive material.

FIG. 14 illustrates the deposition of a conductive material 1402 over the liner layer 1302 in the trenches 1202 and the cavities 702 and 202. The conductive material 1402 may include, for example, a conductive metal such as copper, aluminum, tungsten, or silver or a mixture of conductive metals. The conductive material 1402 may be deposited by, for example using a PVD and/or an electroplate fill process.

Figure 15:
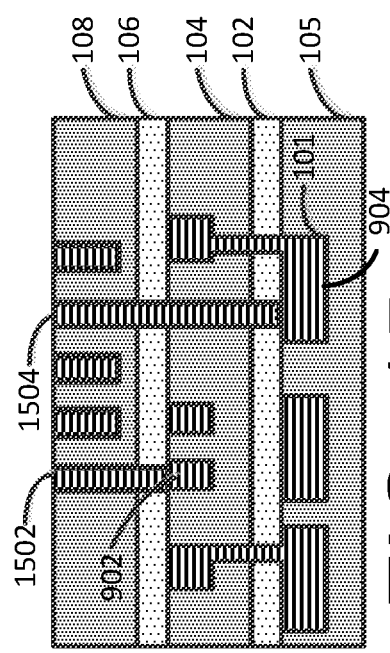
FIG. 15 illustrates the resultant structure following a planarization process.

FIG. 15 illustrates the resultant structure following a planarization process such as, for example, a chemical mechanical planarization (CMP) process that is performed to remove undesired materials from the top of the wafer and to complete the definition of the vias 1502 and 1504. The vias 1502 and 1504 contact the respective interconnects 902 and 904 with a single liner layer 1302 disposed between the vias 1502, 1504 and the interconnects 902, 904. The single liner layer 1302 as opposed to two liner layers reduces the resistance in the connection between the vias 1502, 1504 and the interconnects 902, 904.

Figure 16:
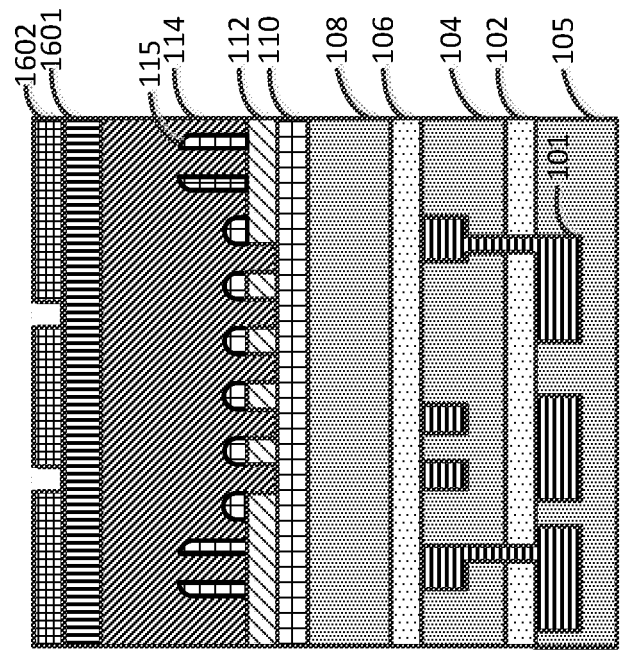
FIG. 16 illustrates an alternate exemplary method for forming vias.

FIG. 16 illustrates an alternate exemplary method for forming vias. In the illustrated embodiment, a resist mask 1602 is patterned on a Siarc hardmask layer 1601 using a suitable lithographic process.

Figure 17:
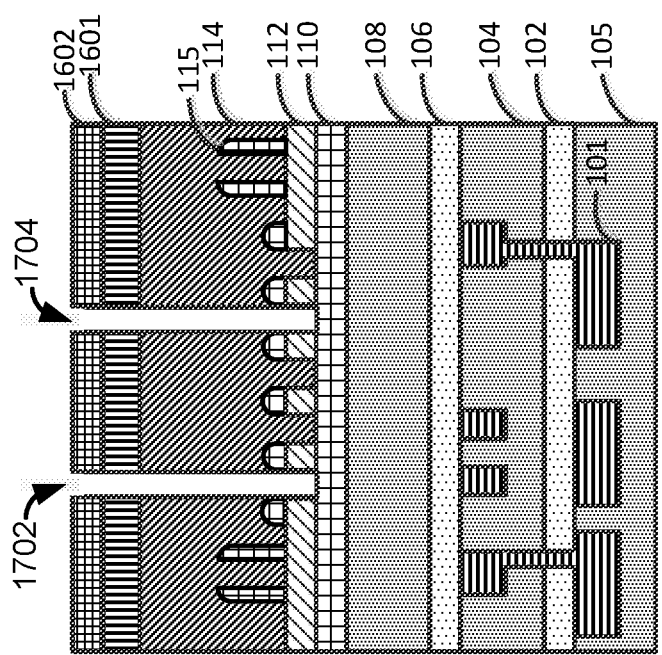
FIG. 17 illustrates the resultant structure following the formation of cavities.

FIG. 17 illustrates the resultant structure following the formation of cavities 1702 and 1704 using, for example, carbon fluorine etching process to etch layer 1601 following the OPL layer 114 etching using, for example, a reactive ion plasma etching process may using an oxygen, nitrogen/hydrogen mixture, or a carbon monoxide/carbon dioxide mixture such that the etching process removes the OPL layer 114 material and ceases when the underlying oxide of the first hardmask layer 110 is exposed.

Figure 18:
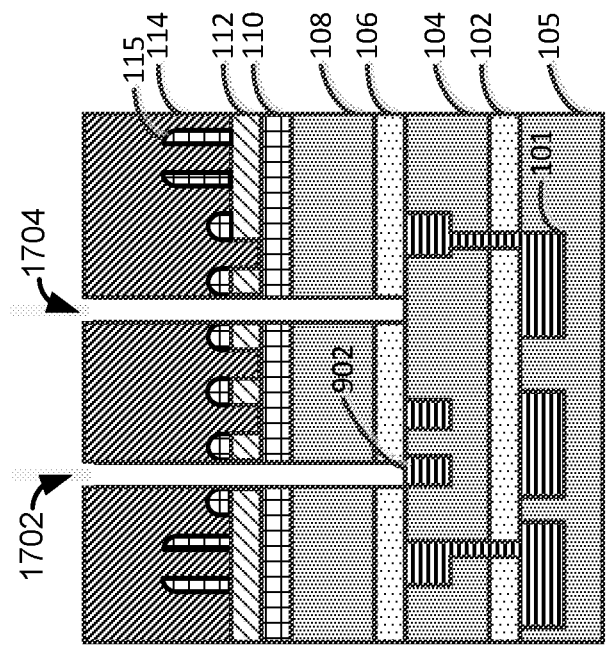
FIG. 18 illustrates the continued formation of the cavities.

FIG. 18 illustrates the continued formation of the cavities 1702 and 1704. In this regard, exposed portions of the first hardmask layer 110, the Siarc layer 1601 and the dielectric layer 108 are removed. The layers 110 and 1601 may be removed by, for example, a carbine fluorine RIE process. The underlying third dielectric layer 108 may be removed by, for example, a carbon hydrogen fluorine RIE process. The etching process also removes portions of the second cap layer 106 to expose a portion of the underlying second dielectric layer 105 in the cavity 1704 and a portion of the interconnect 902 in the cavity 1702.

Figure 19:
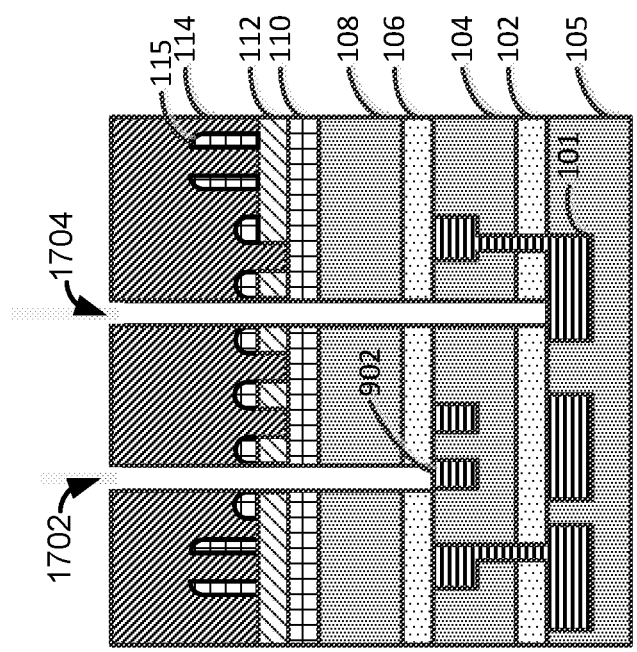
FIG. 19 illustrates the further formation of a cavity.

FIG. 19 illustrates the further formation of the cavity 1704 using an etching process that includes, for example, a carbon-hydrogen fluorine etching process. FIG. 19 shows the removal of a portion of the first cap layer 104 and the barrier cap layer 1004 (shown in FIG. 9), which exposes a portion of the interconnect 904 in the cavity 1704. FIG. 19 is similar to FIG. 10; once the cavities 1702 and 1704 are formed as shown in FIG. 19, the method described above in FIGS. 11-15 may be used subsequently to form vias similar to the vias 1502 and 1504 (of FIG. 15).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a via in an integrated circuit, the method comprising:
    patterning and removing exposed portions of a first organic self-planarizing polymer (OPL) layer to form a first cavity that exposes a first hardmask;
    removing an exposed portion of the first hardmask in the first cavity to expose a second hardmask;
    removing an exposed portion of the second hardmask in the first cavity to expose a portion of a second OPL layer;
    removing the first OPL layer to expose the first hardmask and removing an exposed portion of the second OPL layer in the first cavity to expose a portion of a third hardmask;
    removing an exposed portion of the third hardmask in the first cavity to expose a portion of a first dielectric layer;
    removing an exposed portion of the first dielectric layer in the first cavity to expose a first portion of a first cap layer;
    depositing a third OPL layer in the first cavity and over the first hardmask;
    removing a portion of the third OPL layer to form a second cavity that exposes a second portion of the first hardmask;
    removing the second portion of the first hardmask in the second cavity to expose a second portion of the second hardmask;
    removing the second portion of the second hardmask in the second cavity to expose a second portion of the second OPL layer;
    removing portions of the third OPL layer and the first hardmask to expose the second hardmask and removing portions of the third OPL layer in the first cavity;
    removing the second portion of the second OPL layer in the second cavity to expose a second portion of the third hardmask and removing exposed portions of the third OPL layer in the first cavity to expose the portion of the first cap layer;
    removing an exposed portion of the third hardmask in the second cavity to expose a second portion of the first dielectric layer and removing the portion of the first cap layer in the first cavity to expose a first portion of a second dielectric layer;
    removing the second portion of the first dielectric layer in the second cavity to expose a second portion of the first cap layer and removing the first portion of the second dielectric layer to expose a first portion of a second cap layer; and
    removing the first portion of the second cap layer in the first cavity to expose a first conductive contact and removing the second portion of the first cap layer to in the second cavity to expose a second conductive contact.

* * * * *